United States Patent
Gordon (12)

(10) Patent No.: US 6,180,190 B1
(45) Date of Patent: *Jan. 30, 2001

(54) VAPOR SOURCE FOR CHEMICAL VAPOR DEPOSITION

(75) Inventor: Roy G. Gordon, Cambridge, MA (US)

(73) Assignee: President and Fellows of Harvard College, Cambridge, MA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/201,585

(22) Filed: Nov. 30, 1998

Related U.S. Application Data

(60) Provisional application No. 60/067,188, filed on Dec. 1, 1997.

(51) Int. Cl.[7] ................................................. C23C 16/448
(52) U.S. Cl. ...................... 427/565; 427/180; 427/248.1; 427/255.23; 427/255.29
(58) Field of Search ................................. 427/565, 248.1, 427/255.23, 255.29, 180; 118/715, 726

(56) References Cited

U.S. PATENT DOCUMENTS

| | | | |
|---|---|---|---|
| 4,689,247 | * 8/1987 | Doty et al. | 427/126.1 |
| 5,120,703 | 6/1992 | Snyder et al. | 505/1 |
| 5,421,895 | * 6/1995 | Tsubouchi et al. | 118/726 |

FOREIGN PATENT DOCUMENTS

| | | |
|---|---|---|
| 3729381 | 3/1989 | (DE) . |
| 3729391 | * 3/1989 | (DE) . |
| 0 677 326 A1 | 10/1995 | (EP) . |
| 5-271940 | 10/1993 | (JP) . |
| 5-287534 | 11/1993 | (JP) . |
| 6-184749 | 7/1994 | (JP) . |
| 9-41144 | 2/1997 | (JP) . |
| 9-49081 | 2/1997 | (JP) . |
| 9-228048 | 9/1997 | (JP) . |
| 10140356 | 5/1998 | (JP) . |

OTHER PUBLICATIONS

Matsuno et al., "Metalorganic Chemical Vapor Deposition Using a Single Solution Source for High $J_cY_1Ba_2Cu_3O_{7-x}$ Superconducting Films" *Applied Physics Letters* 60:2427–2429, May, 1992.

Roger et al., "Aerosol–assisted Chemical Vapor Deposition of Copper: A Liquid Delivery Approach to Metal Thin Films" *Applied Physics Letters* 65:1021–1023, Aug., 1994.

* cited by examiner

*Primary Examiner*—Timothy Meeks
(74) *Attorney, Agent, or Firm*—Clark & Elbing LLP; Mary Rose Scozzafava

(57) ABSTRACT

An apparatus is used to turn liquids into vapors for use in chemical vapor deposition. It uses a high-frequency ultrasonic plate to break the liquid into tiny droplets and a gas-dynamic sorting tower to reprocess larger droplets into smaller ones before quickly vaporizing them. The method can vaporize liquids with high efficiency even if they have low vapor pressures and limited thermal stability. The vapor concentration can be set to a known and reproducible value by setting the pumping rate. The apparatus can rapidly start and stop the vapor flow. The pressure drop in the carrier gas is very small. Only a very small dead volume of liquid is contained in the apparatus at any given time, so little is wasted when the system is cleaned.

15 Claims, 1 Drawing Sheet

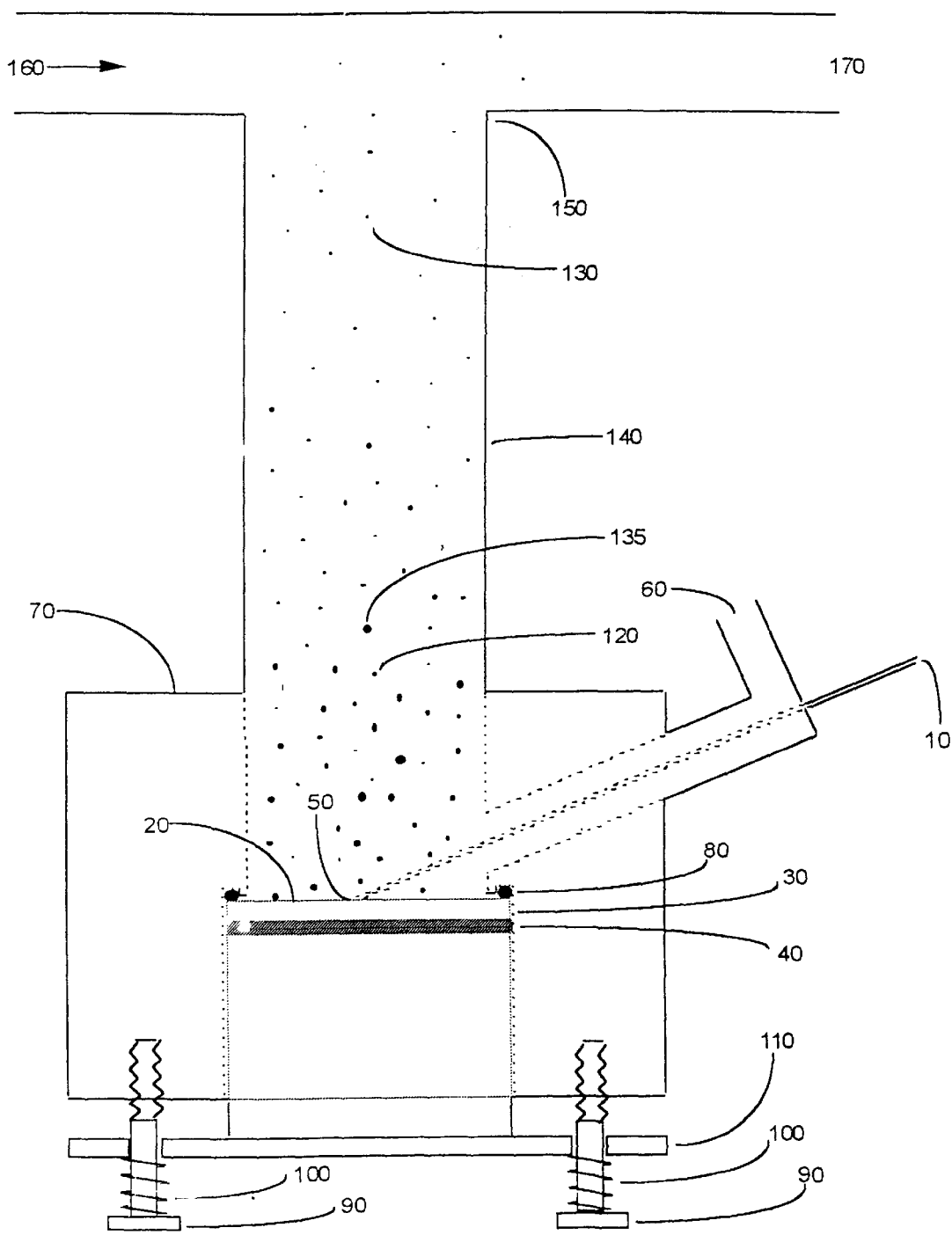

VAPOR SOURCE FOR CHEMICAL VAPOR DEPOSITION

This application claims the benefit of priority under 35 U.S.C. §119(e) to co-pending U.S. Provisional Application Ser. No. 60/067,188 which was filed on Dec. 1, 1997 and which is entitled "Vapor Source for Chemical Deposition", the contents of which are incorporated in its entirety by reference.

This invention was made with the support of United States government under National Science Foundation Grant No. NSF CHE-95-10245. The United States government may have certain rights in the invention.

BACKGROUND OF THE INVENTION

1. Field of the Invention

This invention relates to a novel process for vaporizing liquid reagents for use in CVD reactions. The invention further relates to an apparatus and method for creating a vapor containing controlled amounts of suitably reactive chemicals.

2. Description of the Related Art

Chemical vapor deposition (CVD) is a widely-used process for forming solid materials, such as coatings or powders, from reactants in the vapor phase. Reviews of CVD processes have been published recently in "CVD of Nonmetals," W. S. Rees, Jr., Editor, VCH Publishers, Weinheim, Germany, 1996; "CVD of Compound Semiconductors," A. C. Jones and P. O'Brien, VCH, 1996; and "The Chemistry of Metal CVD," T. Kodas and M. Hampden-Smith, Editors, VCH, 1994. In CVD processes, a reactant vapor may be created by heating a liquid to a sufficiently high temperature and bubbling a flow of a carrier gas through the liquid, to transport the vapor into the CVD chamber. In a low-pressure CVD system, the carrier gas may be omitted, and the vapor may flow directly from the bubbler into the low-pressure CVD chamber.

Thermal decomposition of materials in heated bubblers can reduce the reproducibility and purity of vapors delivered from bubblers. Thermal decomposition may be minimized by rapid or "flash" vaporization. This can be accomplished by pumping the liquid at a steady, controlled rate onto a hot surface from which the liquid vaporizes quickly. In such a "direct liquid injection" (DLI) system, each part of the liquid is heated for only a short time, and its vapor can be formed without significant decomposition even from thermally sensitive liquids. Another advantage of a DLI system is that multicomponent mixtures can be vaporized in a fixed and reproducible ratio, even if the components differ in volatility. Commercial DLI systems are produced by NIKS Instruments (Andover, Mass.), Advanced Technology Materials (Danbury, Conn.), Novellus Systems, (San Jose, Calif.), COVA Technologies (Tiburton, Calif.), [and] Artisan Industries (Waltham, Massachusetts) and Bronkhorst Hi-Tec B. V. (Ruurlo, Netherlands).

These DLI systems have some disadvantages, in that the heated surfaces can catalyze the decomposition of the liquid precursor as it is evaporating. Decomposition products can build up on the heated surfaces and eventually require cleaning or replacement of parts of the vaporizer. Also, some of them produce a significant pressure drop in the carrier gas flow.

Solids can also be used as sources of vapor in CVD processes. However, when solids are used in a bubbler, the rate of vapor production by sublimation of a solid is not easily reproducible, because the amount of vapor produced often depends on the particle size and shape, which change as the sublimation process continues. Thus the vapor concentration can change in an uncontrolled way, thereby changing the growth rate and/or the composition of materials made by the CVD process. Also, different batches of solid may have different sizes and shapes of particles, so that the results of a CVD process may change when a new batch of solid precursor is placed in the system.

Solid sources can be used in DLI vapor sources if a suitable liquid solvent can be found to dissolve the solid. However, solvents can introduce other difficulties, such as increased flammability, toxicity or corrosiveness, and an increased volume of gaseous byproducts, which must be removed from the exhaust gases to avoid pollution. When solutions are introduced into a DLI system, the solvent can evaporate, leaving a solid residue which builds up on the heated surface, and may decompose there, rather than vaporize.

Ultrasonic nebulization has been used to overcome some of these difficulties with vaporization of solutions. For example, the Pyrosol process (Sepr Co., France) applies) ultrasonic power to a large container of solution, causing a spray of droplets to leave from its surface. However, the rate at which the solution is nebulized in the Pyrosol process is not easily controlled, because it is dependent on the composition and temperature of the solution, and the depth to which its container is filled. It takes many minutes to stabilize the rate of nebulization, during which time the temperature of the solution rises to a steady-state value because of the high ultrasonic power put into the solution, and the concentration of the solution rises due to evaporation of part of the solvent.

SUMMARY OF THE INVENTION

A principal object of the present invention is to provide a well-controlled method for vaporizing liquids or liquid solutions.

A related object is to vaporize liquids or liquid solutions quickly, thereby avoiding thermal decomposition.

An additional object of the present invention is the vaporization of liquids or liquid solutions without generating non-volatile residue.

Another object of the present invention is to provide a process for vaporizing liquids or liquid solutions wherein the vaporization process can be quickly turned on or off.

A further object of the present invention is to provide a process for vaporizing liquids or liquid solutions wherein the vaporization process can be quickly adjusted to any predetermined rate.

A further object of the present invention is to provide a reproducible source of vapors into a chemical vapor deposition process.

Another object of the invention is to provide a process for forming a mist of droplets having a predetermined maximum size.

An additional object the invention is to provide complete utilization of the liquid precursor in a system with a small "dead" volume.

Another object of the invention is to provide a process for chemical vapor deposition of metal oxides having low carbon content.

A particular object of the invention is to provide a process for the deposition of barium titanate.

A further object of the invention is to provide an apparatus for carrying out the above-described processes.

Other objects of the invention will be obvious to those skilled in the art on reading the instant invention.

The above objects have been substantially achieved by a process in which a liquid or liquid solution is delivered onto a surface that is vibrating with sufficient amplitude to break the liquid or liquid solution up into microscopic droplets, conveying these droplets upward by a controlled flow of carrier gas into a heated region in which they vaporize. A film of desired composition is deposited by causing these vapors to react at a heated surface so as to deposit a material on that surface. In another embodiment, the vapors are further heated to form a fine powder.

In preferred embodiments the liquid is delivered at a steady rate to enable accurately and precisely controlled deposition rates. In other preferred embodiments, the liquid is delivered in pulses, between which the deposited material is annealed to achieve improved properties, such as higher purity.

BRIEF DESCRIPTION OF THE DRAWING

The invention is described with reference to the FIGURE which is presented for the purpose of illustration only and which is in no way intended to be limiting of the invention, and in which the FIGURE provides a schematic illustration on an embodiment of an apparatus of the invention, which may be used in the practice of the method of the invention.

DETAILED DESCRIPTION OF THE INVENTION

The FIGURE shows a schematic cross section of an apparatus which may be used to carry out a preferred embodiment of the invention. The liquid or solution is caused to flow from a reservoir (not shown) by a metering pump or by gas pressure on the liquid reservoir, at a steady rate through an inlet tube 10 (for example, hypodermic needle tubing with inner diameter 0.25 mm) onto a vibrating upper surface 20 of plate 30, e.g., a quartz plate, driven by vibrating means 40, e.g., a piezoelectric transducer, attached to its bottom surface. An outlet tip 50 of the inlet tube 10 may be spaced a small distance (for example, 0.05 mm) above the upper surface of the plate 30. In an alternative embodiment, the tip 50 may touch the surface. As the liquid flows onto the vibrating surface 20, it breaks up into droplets of varying sizes that are projected upward into a first carrier gas entering from inlet tube 60 through the housing 70. A seal is used to contain the carrier gas and the liquid droplets 120 inside housing 70. An exemplary seal includes, but is not limited to an O-ring 80, compressed by screws 90 acting on springs 100 pushing against plate 110. Other means of sealing will be apparent to those skilled in the art.

The flow of the first carrier gas lifts smaller droplets 130 through a passageway 140 into a tee joint 150. Larger droplets 135, e.g., those whose terminal velocity is larger than the maximum flow velocity of the first carrier gas in the tube 140, fall back onto the vibrating surface 20 where they are broken down into smaller droplets 130, some of which are small enough to be carried to the tee joint 150. By this recycling of the larger droplets, they are all eventually broken down into small enough droplets to be carried up to the tee joint 150, where they meet a flow of a second carrier gas, which flows in the direction indicated by arrow 160. The preferred smaller droplets are typically less than 20 microns in diameter. In one embodiment of the invention, the second carrier gas is heated. If the second carrier gas is preheated to a high enough temperature, the small droplets quickly vaporize, and the vapor mixture is carried flowise downstream in tube 170 to a CVD chamber (not shown) where they are deposited. Alternatively, the second carrier gas is not preheated, so that the small droplets are carried intact into the CVD chamber, where they vaporize close to the surface of a heated substrate (not shown) and cause material to be deposited on the heated substrate.

The rate at which the liquid flows through tube 10 is kept small enough so that the total amount of liquid on the ultrasonic plate of the nebulizer at any time is very small, less than 1 cubic centimeter, and more preferably less than 0.1 cubic centimeter. Liquid flow rates are typically around 1 cubic centimeter per minute or less, for a plate 20 with diameter 2.5 cm. Because of this small liquid holdup, the delivery of mist from the nebulizer can be started and stopped very quickly by turning on or off the liquid flow onto the plate. Because of this capability for turning on and off the flow of a liquid reactant to a chemical vapor deposition process, deposition of a thin layer may be followed by annealing in a different gas, in order to alter the composition of the film. For example, an oxidizing gas may be introduced after deposition of a thin layer, in order to decrease the carbon content of an oxide film. This cycle of deposition and oxidation may then be repeated in order to build up thicker layers of pure oxide material. This method then allows the use of an oxidizing gas whose presence would be deleterious during the deposition stages, because it would cause premature reaction of the precursor.

Smaller droplets vaporize faster and more cleanly than larger droplets, because the smaller droplets have a higher ratio of surface to volume, so that the transfer of heat up to the surface is faster. Because the heating is faster, the opportunity for undesirable decomposition of the droplets is minimized.

The typical size of the ultrasonically generated droplets decreases with increasing ultrasonic frequency. In order to generate the smallest possible droplets, the ultrasonic frequency should be as high as possible. A frequency over one megahertz (one million cycles per second) is most desirable, although lower frequencies, such as 500 kilohertz, can give satisfactory results. A frequency of 1.35 megahertz was used in the following examples.

The viscosity of the liquid should not be too large, or the droplets will not form. A liquid with viscosity less than 10 centipoise, or more preferably, less than 5 centipoise, can be broken into droplets with an ultrasonic power density of 7 watts per square centimeter of surface. This power level was used in the following examples. Liquids with higher viscosity can be nebulized with a higher power density. Alternatively, liquids with a high viscosity can be diluted with a solvent of lower viscosity. For example, liquid precursors may be miscible with low-viscosity organic solvents, including hydrocarbons, such as dodecane, tetradecane, xylene and mesitylene, and with alcohols, ethers, esters, ketones and chlorinated hydrocarbons.

Modification of the apparatus and method are contemplated as within the scope of the invention. For example, modifications necessary for scale-up are considered to be within the scope of one skilled in the art.

EXAMPLE 1

A liquid precursor for the CVD of aluminum oxide, triethyldialuminum tri-sec-butoxide, was prepared by mixing equimolar amounts of triethylaluminum and aluminum sec-butoxide and heating the mixture to about 180° C. for about 6 hours. The majority of the reaction is described as $$Et_3Al + Al(sec\text{-}C_4H_9)_3 \rightarrow Et_3Al_2(sec\text{-}C_4H_9)_3$$

By carbon-13 NMR analysis, the resulting reaction product was found to be a mixture containing about 51 mole percent triethyldialuminum tri-sec-butoxide along with smaller amounts of diethyldialuminum tetra-sec-butoxide (about 20 mole percent) and tetraethyldialuminum di-sec-butoxide (about 29 mole percent). Cryoscopic molecular weight determinations showed that these compounds are dimeric in cyclohexane solution. We will refer to this mixture by the name of its major component, triethyldialuminum tri-sec-butoxide. The triethyldialuminum tri-sec-butoxide mixture is a clear, non-viscous liquid, which may be distilled over a temperature range of about 183–186° C. at a pressure of 40 millibars. Because the volatilities and reactivities of these three alkylaluminum alkoxides are similar, the mixed reaction product may be used as a reactant in CVD processes without further separation or purification.

The liquid triethyldialuinum tri-sec-butoxide was pumped by a syringe pump into the nebulizer at a rate of 0.05 cc/min, where a 1 L/min flow of nitrogen carrier gas at 1 atmosphere pressure carried it up the tube 140. The mist appeared in column 140 within about 1 second after the flow of liquid was started. At the top of the tower the mist was vaporized by a flow of 8 L/min of nitrogen carrier gas preheated to 200° C. Then the vapor mixture was mixed with a flow of 1 L/min of oxygen gas. This mixture was then carried in tubing heated to 200° C. into a rectangular atmospheric pressure reactor With interior dimensions 12 cm wide and 1 cm high, the bottom surface of which was a glass substrate heated to 400° C., while the top surface of the reactor volume was held at a temperature of 250° C. The mist disappeared from the tube 140 within about 1 second after the flow of liquid was stopped. A film of amorphous aluminum oxide was deposited on the glass.

EXAMPLE 2

Preparation of liquid metal beta-diketonate precursors. The beta-diketone ligands were prepared by the Claisen condensation of an ethyl ester and a methyl ketone in the presence of a strong base, such as sodium hydride, followed by acid hydrolysis and distillation of the crude product.

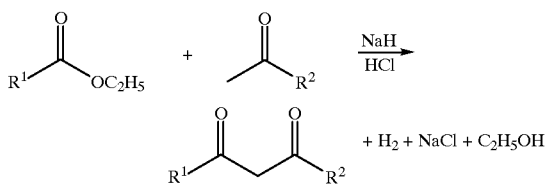

The alkyl groups $R^1$ and $R^2$ are randomly selected from tert-butyl, sec-butyl, iso-butyl and isopropyl. The exact proportions do not appear to be critical, and we have used equal molar proportions of the alkyl groups. The individual beta-diketones may be prepared separately and then mixed before combining them with the metal. A simpler procedure is to condense simultaneously a mixture of methyl ketones, such as tert-butyl methyl ketone, sec-butyl methyl ketone, isobutyl methyl ketone and methyl isopropyl ketone, along with a mixture of ethyl esters, such as ethyl isobutyrate, ethyl isovalerate, ethyl 2-methylbutyrate and ethyl trimethylacetate.

Synthetic Techniques and Reagents. All manipulations were carried out using standard Schlenk techniques under dry nitrogen either in a drybox or on a Schlenk line unless otherwise stated. Diethyl ether ($Et_2O$), N,N,N',N',N"-pentamethyldiethylenetriamine (pmdeta) and tetrahydrofuran (THF) were distilled from appropriate drying agents and stored under nitrogen over molecular sieves prior to use. $Ti(O^iPr)_4$ were purchased from Aldrich and used as received. Barium and strontium were purchased from Cerac and used as received.

Synthesis of the Beta-Diketonate Ligand Mixture. The ketone mixture was added slowly and steadily over 3 hours to a rapidly-stirred mixture of the esters, sodium hydride and toluene heated to 90° C., using a syringe pump. After cooling and stirring overnight, the mixture was neutralized with aqueous hydrochloric acid and the organic layer was separated. The product mixture was distilled from the crude organic layer at 30 mbar pressure and a temperature ranging from about 70–110° C., and dried over molecular sieves.

Yields were around 80%. By proton-decoupled carbon-13 NMR analysis in deuterochloroform, the resulting reaction product was found to be a mixture containing ten of the beta-diketone ligands. Table 1 gives the chemical shifts of the central carbon between ketone groups, in the major (enol) forms of these compounds, as identified by separate syntheses of the pure compounds. This single resonance line is easily resolved for each compound in this mixture, making it useful for analysis, whereas other lines in the proton and C-13 NMR spectra are badly overlapped. Table 1 also gives the numbers assigned by Chemical Abstracts to eight previously known compounds in this mixture. The general formula is written $R^1C(=O)CHR^3C(=O)R^2$, where $R^3$=H in all these examples.

TABLE 1

NMR data for the beta-diketone ligands

| Name | $R^1$ | $R^2$ | Chemical Shift C13 NMR, ppm | Chemical Abstracts No. |
|---|---|---|---|---|
| 2,6-dimethyl-3,5-heptanedione | iso-Pr | iso-Pr | 94.9 | 5773-60-5 |
| 2,7-dimethyl-3,5-octanedione | iso-Pr | iso-Bu | 97.8 | 7307-07-5 |
| 2,6-dimethyl-3,5-octanedione | iso-Pr | sec-Bu | 96.0 | not reported |
| 2,2,6-trimethyl-3,5-heptanedione | iso-Pr | tert-Bu | 92.9 | 733-23-5 |
| 2,8-dimethyl-4,6-nonanedione | iso-Bu | iso-Bu | 100.6 | 7307-08-6 |
| 2,7-dimethyl-4,6-nonanedione | iso-Bu | sec-Bu | 98.8 | not reported |
| 2,2,7-trimethyl-3,5-octanedione | iso-Bu | tert-Bu | 95.7 | 69725-37-7 |
| 3,7-dimethyl-4,6-nonanedione | sec-Bu | sec-Bu | 97.0 | 43865-74-2 |
| 2,2,6-trimethyl-3,5-octanedione | sec-Bu | tert-Bu | 94.0 | 34865-71-9 |
| 2,2,6,6-tetramethyl-3,5-heptanedione | tert-Bu | tert-Bu | 90.6 | 1118-71-4 |

Synthesis of a barium beta-diketonate mixture, Ba(beta-diketonate)$_2$. Ba (0.878 g, 6.39 mmol) and pmdeta (2.22 g, 12.8 mmol) were placed together in a flask and 7 mL of THF was added. Bubbles were evolved slowly upon addition of a beta-diketone mixture (2.26 g, 12.8 mmol) diluted with 7 mL of THF. The reaction, more intense after passing $NH_3$ through the solution for 5 minutes, continued for 20 minutes until there was very Little metal. The $NH_3$ flow was continued for another 5 minutes followed by 15 minutes of stirring until only flecks of metal remained. On addition of $NH_3$ to the solution the second time, a light green gel, perhaps Ba(beta-diketonate)$_2$(NH$_3$)$_x$, formed but slowly disappeared on stirring under flowing $N_2$. The solution was then filtered through celite and the solvent was removed in vacuo to leave a light yellow liquid (4.16 g, 78% yield).

This viscous liquid barium beta-diketonate mixture was diluted with 3 times its mass of liquid N,N,N',N',N''-pentamethyldiethylenetriamine, and the liquid solution was pumped from a syringe pump into the nebulizer, where a flow of 200 cc/min of nitrogen carrier gas at a pressure of 40 millibar carried the droplets to the top of the tower. At the top of the tower, the mist was entrained in an additional flow of 0.1 L/min of nitrogen carrier gas, which carried the mist into a 2.5 mm diameter quartz tube in a tube furnace, heated to 600° C., having a silicon substrate placed on the bottom of the quartz tube. The exhaust gases were cleaned in a liquid nitrogen cold trap, from which the nitrogen passed through a pressure control valve into a vacuum pump. On the silicon substrate a film of barium carbonate was deposited.

EXAMPLE 3

Synthesis of titanyl beta-diketonate mixture TiO(β-diketonate)). A β-diketone mixture prepared as in Example 2 (8.01 g, 48.2 mmol) and diluted with 10 mL of $Et_2O$ was cannula-transferred to $Ti(O^iPr)^4$ (6.85 g, 24.1 mmol) diluted with 10 mL of $Et_2O$. The reaction produced heat and resulted in an amber-colored solution. After complete addition, the solvent was removed in vacuo leaving an orange-brown liquid. This was heated to 90° C. for 1 min under static vacuum and then stirred under dynamic vacuum for 5 min. The process was repeated twice resulting in a very dark brown liquid. Then, 50 mL of THF was added and the reaction was stirred under air for 5 min. The solution gradually began to turn red upon dropwise addition of $H_2O$ (0.66 mL, 36.7 mmol) and was very dark red after stirring 12 hr. After heating to 50° C. for 30 min, the solvent was removed in vacuo and the resulting viscous liquid was pumped on for 4 hr (both done at 50° C.). On cooling, the liquid eventually became a solid, very dark brown glass (9.47 g, 94% yield).

This titanyl beta-diketonate mixture vas combined with 1.4 times the molar quantity of the barium beta-diketonate mixture prepared in Example 2 and dissolved in three times their mass of liquid N,N,N',N',N''-pentamethyldiethylenetriamine. A chemical vapor deposition experiment was carried out as in Example 2. The silicon substrate was found to have a coating of barium titanate contaminated with over 20 atomic percent carbon.

EXAMPLE 4

Example 3 was repeated, except that after flowing about 0.5 cubic centimeters of liquid, corresponding to deposition of about 5 nm of material, the liquid flow was stopped and oxygen gas was flowed through the tube furnace for 5 minutes. This cycle was repeated 8 times. The deposited film was found to be barium titanate with no detectable carbon (less than 1 atomic percent).

Those skilled in the art will recognize or be able to ascertain using no more than routine experimentation, many equivalents to the specific embodiments of the invention described specifically herein. Such equivalents are intended to be encompassed in the scope of the following claims.

What is claimed is:

1. A process for vaporizing a liquid or liquid solution comprising the steps of:
   a. delivering a liquid or liquid solution onto a vibrating surface in sealing contact with a passageway positioned above said vibrating surface to break the liquid or liquid solution up into droplets;
   b. conveying said droplets upward through said passageway in a flow of carrier gas whereby only droplets smaller than a predetermined size reach the top of the passageway, and whereby substantially all droplets larger than said predetermined size are redirected onto said vibrating surface for renebulization; and
   c. conveying said smaller droplets into a heated region in which they turn into a vapor.

2. The process of claim 1, further comprising:
   causing said vapor to react at a heated surface so as to deposit material on that surface.

3. The process of claim 1, further comprising:
   heating said vapor so that it forms a powder.

4. The process of claim 3, wherein the liquid or liquid solution is delivered in cycles, between which the powder is annealed.

5. The process of claim 1, wherein the surface vibrates at an ultrasonic frequency.

6. The process of claim 5, in which said ultrasonic frequency is larger than one hundred thousand cycles per second.

7. The process of claim 5, in which said ultrasonic frequency is larger than one million cycles per second.

8. The process of claim 1, 2, or 3 in which no more than 1 cubic centimeter of liquid is present on the surface of said vibrating surface.

9. The process of claim 1, 2 or 3 in which no more than 0.1 cubic centimeter of liquid is present on the surface of said vibrating surface.

10. The process of claim 1, 2 or 3 in which the conveyance of droplets is capable of being started or stopped within a period of 10 seconds.

11. The process of claim 1 in which the flow of liquid is repeatedly started and stopped.

12. The process of claim 11, further comprising ceasing flow of liquid onto the vibrating surface; and
   introducing a second carrier gas during periods when the liquid flow is stopped.

13. The process of claim 12, in which said second gas comprises an oxidizing gas selected from the group consisting of dioxygen, nitrous oxide and ozone.

14. The process of claim 1, 2, or 3 wherein the liquid or liquid solution is delivered in cycles, between which the deposited material is annealed.

15. The process of claim 1, 2, or 3 wherein the liquid or liquid solution is introduced onto the vibrating surface at a rate that is slow enough so that any liquid or liquid solution which accumulates on said vibrating surface is nebulized within 10 seconds after delivery of the liquid onto the vibrating surface has ceased.

* * * * *